(12) United States Patent
Choi

(10) Patent No.: US 7,217,926 B1
(45) Date of Patent: May 15, 2007

(54) SYSTEMS INVOLVING VOLTAGE-TUNABLE QUANTUM-WELL INFRARED PHOTODETECTORS (QWIPS) AND RELATED METHODS

(75) Inventor: Kwong-Kit Choi, Brookeville, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/798,967

(22) Filed: Mar. 12, 2004

(51) Int. Cl.
*G01J 5/02* (2006.01)

(52) U.S. Cl. ............... 250/339.02; 250/332; 257/21; 257/440

(58) Field of Classification Search ......... 250/339.02, 250/332; 257/21, 440
See application file for complete search history.

(56) References Cited

U.S. PATENT DOCUMENTS

| | | | | |
|---|---|---|---|---|
| 5,384,469 | A | 1/1995 | Choi | 257/21 |
| 5,485,015 | A | 1/1996 | Choi | 257/21 |
| 6,130,466 | A | 10/2000 | Schneider et al. | 257/440 |
| 6,211,529 | B1 * | 4/2001 | Gunapala et al. | 257/17 |
| 6,326,639 | B1 | 12/2001 | Schneider et al. | 257/17 |
| 6,410,917 | B1 | 6/2002 | Choi | 250/338.4 |
| 6,521,967 | B1 | 2/2003 | Bandara et al. | 257/440 |
| 6,522,403 | B2 | 2/2003 | Wilson et al. | 356/328 |
| 6,534,783 | B1 * | 3/2003 | Wu et al. | 257/21 |
| 2002/0125472 | A1 * | 9/2002 | Johnson et al. | 257/21 |
| 2004/0108564 | A1 * | 6/2004 | Mitra | 257/442 |
| 2004/0178421 | A1 * | 9/2004 | Kuan et al. | 257/186 |

OTHER PUBLICATIONS

Majumdar, A., et al., "Two-Color Quantum Well Infrared Photodetector With Voltage Tunable Peaks," Applied Physics Letter, vol. 80, No. 3, Feb. 4, 2002, pp. 707-709.
Goldberg, A., et al., "Large Format And Multi-Spectral QWIP Infrared Focal Plane Arrays," Proc. SPIE 5014, AeroSense, Orlando, FL, Apr. 21-25, 2003.
Chen, C.J., et al., "Two-Color Corrugated Quantum-Well Infrared Photodetector For Remote Temperature Sensing," Applied Physics Letter, vol. 72, No. 1, Jan. 5, 1998, pp. 7-9.
Chen, C. C., et al., "Multicolor Infrared Detection Realized With Two Distinct Superlattices Separated By A Blocking Barrier,", Applied Physics Letter, vol. 8, No. 13, Apr. 2002, pp. 2251-2253.
Choi, K. K., "Detection Wavelength of InGaAs/AlGaAs Quantum Well And Superlattices,", Journal of Applied Physics, vol. 91, No. 2, Jan. 15, 2002, pp. 551-564.
Kastalsky, A., et al., "Photovoltaic Detection Of Infrared Light In A GaAs/AlGaAs Superlattice," Applied Physics Letter, vol. 52, No. 16, Apr. 18, 1988, pp. 1320-1322.

(Continued)

*Primary Examiner*—Renee Luebke
*Assistant Examiner*—Mary Zettl
(74) *Attorney, Agent, or Firm*—William V. Adams

(57) ABSTRACT

The present disclosure relates to detection of light (or radiation) at different wavelengths. A voltage-tunable multi-color infrared (IR) detector element receives incident radiation through a substantially-transparent substrate. Side surfaces of the voltage-tunable multi-color IR detector element reflect the incident radiation, thereby redirecting the radiation. The reflected radiation is directed through a voltage-tunable multi-color infrared (IR) detector. Energy proportional to different ranges of wavelengths is detected by supplying different bias voltages across the voltage-tunable multi-color IR detector element.

14 Claims, 12 Drawing Sheets

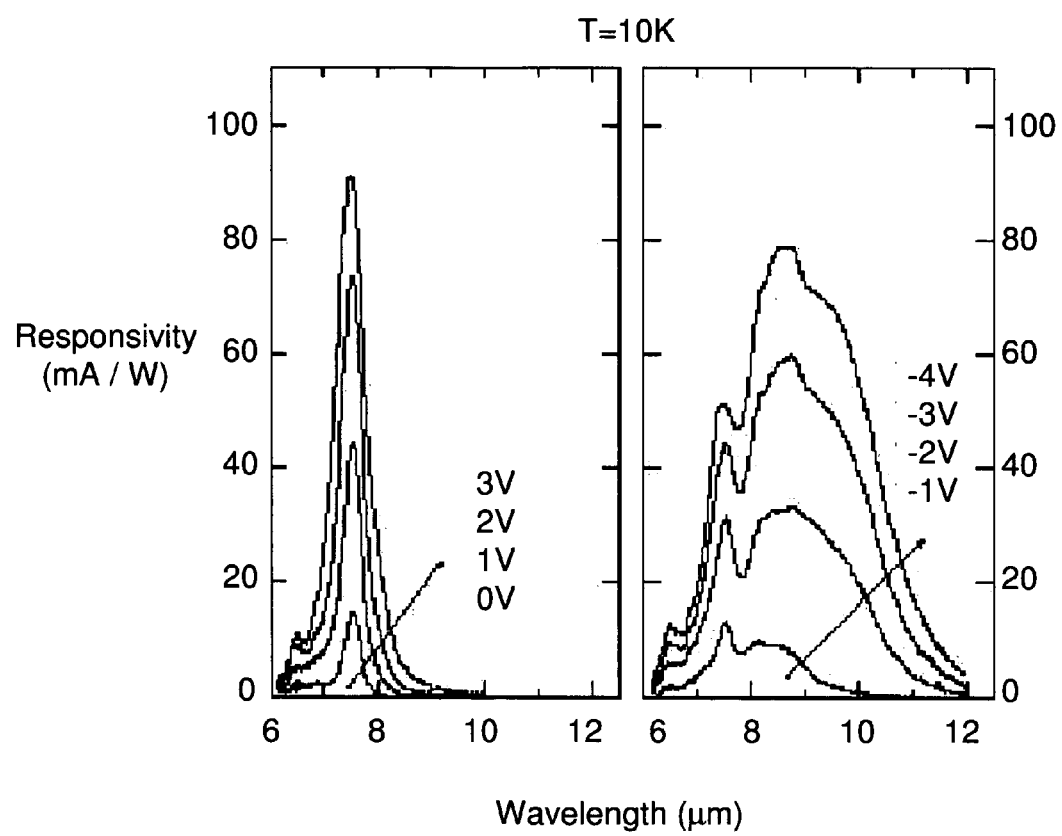

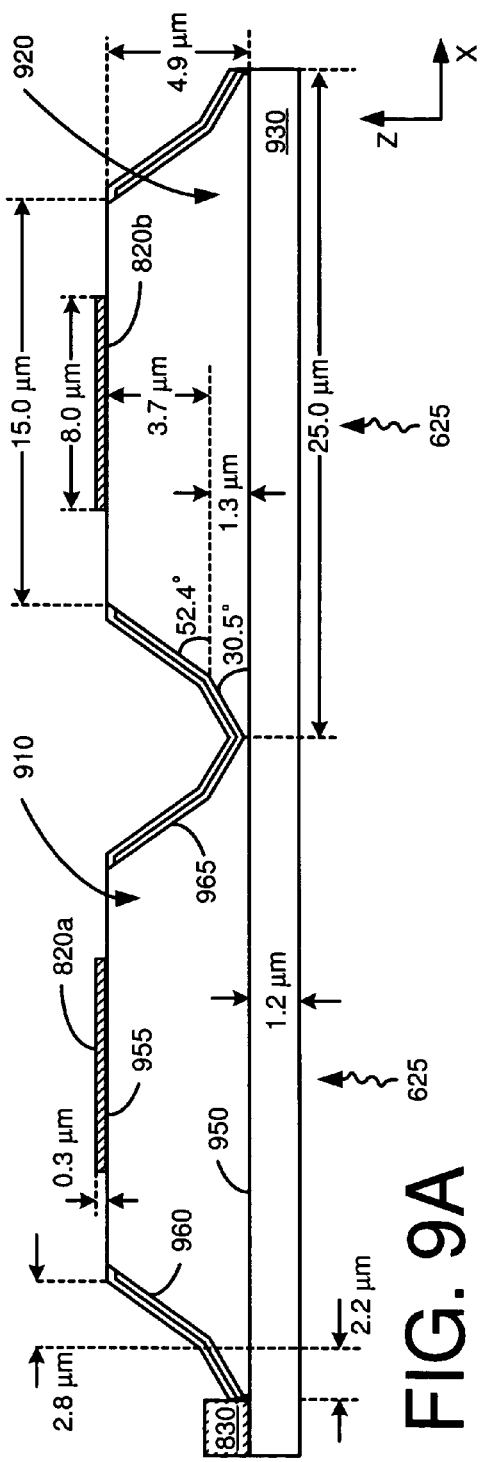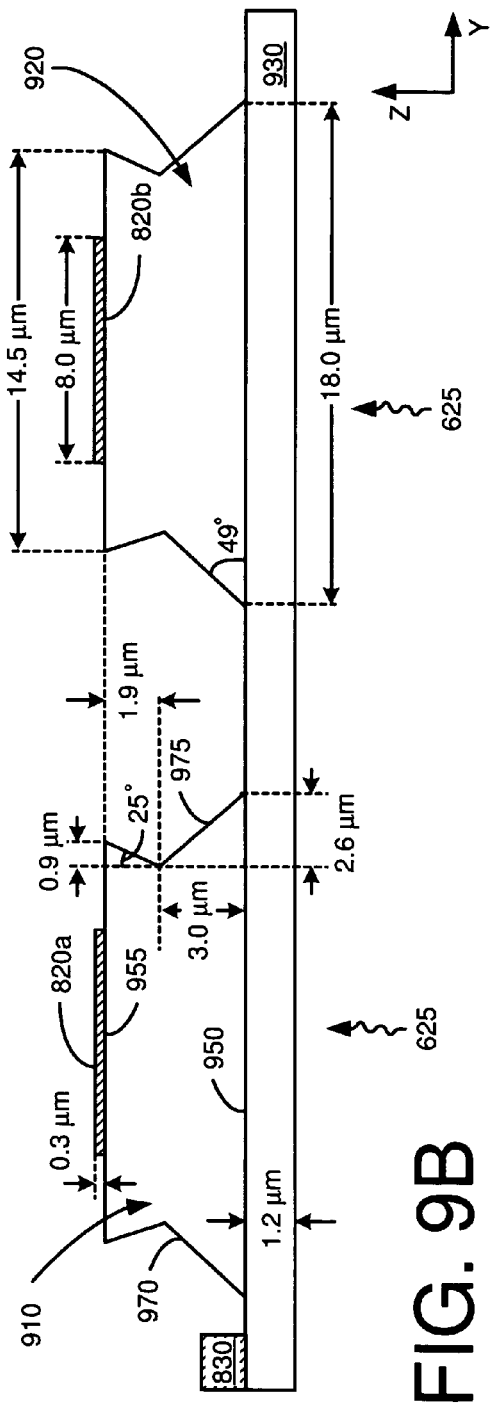
FIG. 9A
FIG. 9B

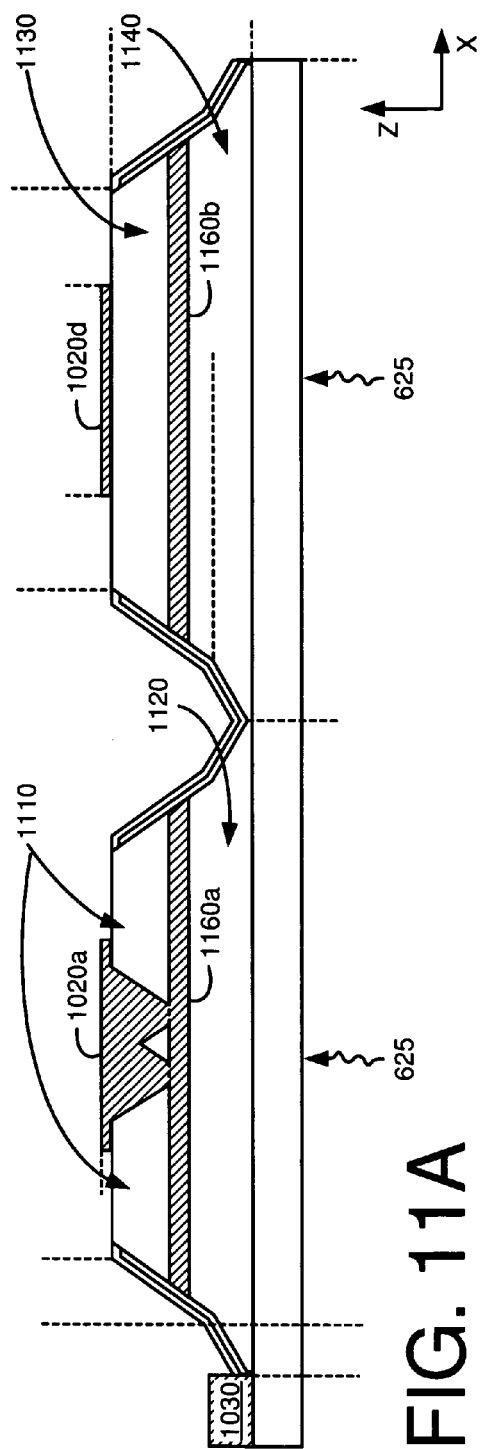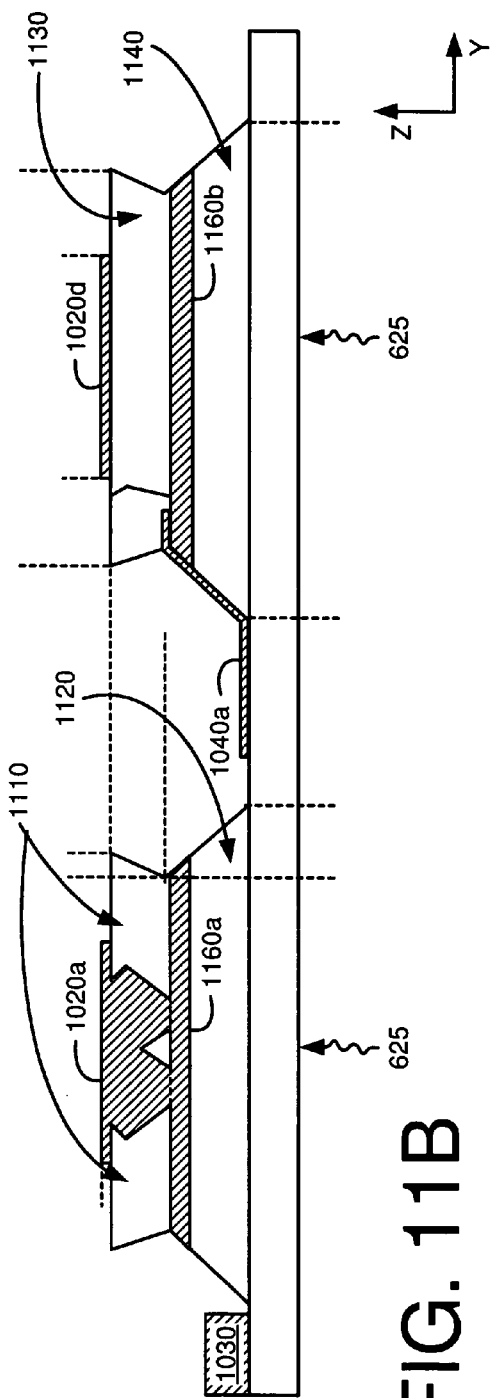

SYSTEMS INVOLVING VOLTAGE-TUNABLE QUANTUM-WELL INFRARED PHOTODETECTORS (QWIPS) AND RELATED METHODS

CROSS REFERENCE TO RELATED APPLICATIONS

U.S. Pat. No. 5,486,015, having the title "Quantum Grid Infrared Photodetector," issued to Choi on Jan. 16, 1996; U.S. Pat. No. 5,384,469, having the title "Voltage-Tunable, Multicolor Infrared Detectors," issued to Choi on Jan. 24, 1994; and U.S. patent application Ser. No. 10/411,232, having the title "Quantum-Grid Infrared Photodetector (QGIP) Spectrometers and Related Methods," filed by Choi on Apr. 11, 2003, are incorporated by reference in their entireties.

GOVERNMENT INTEREST

The invention described herein may be manufactured and used by or for the Government of the United States of America for government purposes without the payment of any royalties therefor.

TECHNICAL FIELD

The present invention relates generally to signal detection and, more particularly, to detection of light (or radiation) at different wavelengths.

DESCRIPTION OF THE RELATED ART

Infrared (IR) focal plane array (FPA) cameras are widely used in diverse fields. For example, in military and various border patrol applications, IR-FPA cameras are used in night-vision goggles. In science, IR-FPA cameras are used in IR astronomy and environmental protection applications. Commercially, IR-FPA cameras have been used in medical imaging applications. Unfortunately, despite their diverse applicability, IR-FPA cameras have conventionally been limited to low-resolution, single-color detection.

SUMMARY

Systems and methods for detecting light (or radiation) at different wavelengths are provided.

Briefly described, in architecture, one embodiment of a system comprises a voltage-tunable multi-color infrared (IR) detector element having sides that redirect incident light. The sides of the voltage-tunable multi-color IR detector element are positioned such that the incident light and the sides are at a substantially non-parallel angle with respect to each other. Thus, the sides reflect the incident light, thereby redirecting the path of the light through the voltage-tunable multi-color IR detector element.

The present disclosure also provides methods for detecting light at different wavelengths. In this regard, one embodiment of a method comprises the steps of receiving incident radiation, reflecting the incident radiation at an angled surface, and directing the reflected radiation through a voltage-tunable multi-color infrared (IR) detector.

Other systems, devices, methods, features and/or advantages will be or may become apparent to one with skill in the art upon examination of the following drawings and detailed description. It is intended that all such additional systems, methods, features, and advantages be included within this description and be protected by the accompanying claims.

BRIEF DESCRIPTION OF THE DRAWINGS

Many aspects of the disclosure can be better understood with reference to the following drawings. The components in the drawings are not necessarily to scale. Moreover, in the drawings, like reference numerals designate corresponding parts throughout the several views.

FIGS. 2A and 2B are charts illustrating different detected wavelength ranges as a function of applied bias voltages across the voltage-tunable multi-color IR detector of FIGS. 1A through 1C.

FIGS. 9A and 9B are diagrams showing side views of the portion of the FPA camera of FIG. 8.

FIGS. 11A and 11B are diagrams showing side views of the portion of the FPA camera of FIG. 10.

DETAILED DESCRIPTION OF THE EMBODIMENTS

Figure 1A:
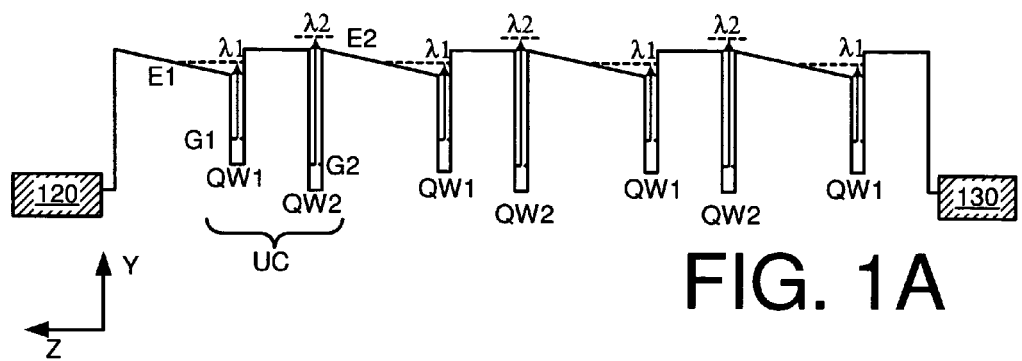
FIGS. 1A through 1C are diagrams illustrating one embodiment of a voltage-tunable multi-color infrared (IR) detector.

Reference is now made to the drawings. While several embodiments are described in connection with these drawings, there is no intent to limit the invention to the embodiments disclosed herein. On the contrary, the intent is to cover all alternatives, modifications, and equivalents.

While infrared (IR) focal plane array (FPA) cameras find diverse applicability in various fields, conventional IR-FPA cameras are typically low-resolution, single-color cameras. Their low resolution and inability to detect multiple colors limit the applicability of conventional IR-FPA cameras.

In contrast to conventional IR-FPA cameras, several embodiments of the invention include systems, devices, and methods for detecting a plurality of colors at a relatively high resolution. In some embodiments, two-color IR-FPA cameras are provided in which the spatial resolutions are readily scalable to 512 by 1024, 1K by 1K, or greater. Also described are various approaches to altering the detection wavelength (or bandwidth) of a multi-color (MC) IR-FPA camera, thereby permitting detection of two, three, four, or more colors at a variety of wavelength ranges.

In some embodiments, an MC-IR-FPA camera comprises a voltage-tunable (VT) quantum-well infrared photodetector (QWIP) material that is electrically coupled to a voltage source. The VT-QWIP material is designed to detect light (or radiation or energy) at different wavelengths (or different wavelength ranges) when different bias voltages are applied to the VT-QWIP material. In this regard, the detected wavelength ranges can be selected by applying different bias voltages across the VT-QWIP material. Since QWIP materials do not readily detect normal incident light, a light coupling scheme is built into the VT-QWIP material to redirect the incident light into parallel propagation for absorption. In some embodiments, the voltage-tunable QWIP material is housed in a "corrugated" structure that has sloped sides. The sloped sides are substantially non-parallel to the incident light. Hence, incident light is reflected from the sides at an angle that is proportional to the slope of the sides. The parallel component of the reflected light is absorbed by the QWIP material. The sides reflect a wide range of wavelengths. Thus, the sloped sides may be seen as a broadband light coupling scheme. The broadband nature of the corrugated coupling scheme and the voltage-tunable characteristics of the VT-QWIP results in multi-color detection. For simplicity, the corrugated light coupling structure in conjunction with the VT-QWIP is referred to herein as a "corrugated VT-QWIP."

One potential advantage of the corrugated VT-QWIP is that different wavelengths may be detected by controlling the applied bias voltage. Another potential advantage of the corrugated VT-QWIP is simplicity of design and fabrication. For example, the fabrication of different color-detection combinations can be based on a single mask design and process flow. As shown in several embodiments below, the focal plane array may be constructed with a single indium bump for each pixel, rather than using multiple indium bumps for each pixel. The single indium bump and the effectiveness of the corrugated light-coupling scheme can facilitate the fabrication of small pixels and, consequently, the fabrication of high-density high-resolution (e.g., 2K-by-2K resolution or higher) FPA cameras. The relatively small number of process steps in constructing the corrugated VT-QWIP can result in reduced fabrication costs and increased yield. Additionally, by using the corrugated light-coupling scheme, which is generally a universal light-coupling scheme for all wavelength combinations, one can ensure high sensitivity for a variety of wavelength combinations. These and other characteristics of the corrugated VT-QWIP materials may permit construction of portable FPA cameras. Several embodiments of systems, devices, and methods related to corrugated VT-QWIP structures are described in greater detail with reference to FIGS. 1A through 12.

Figure 1B:
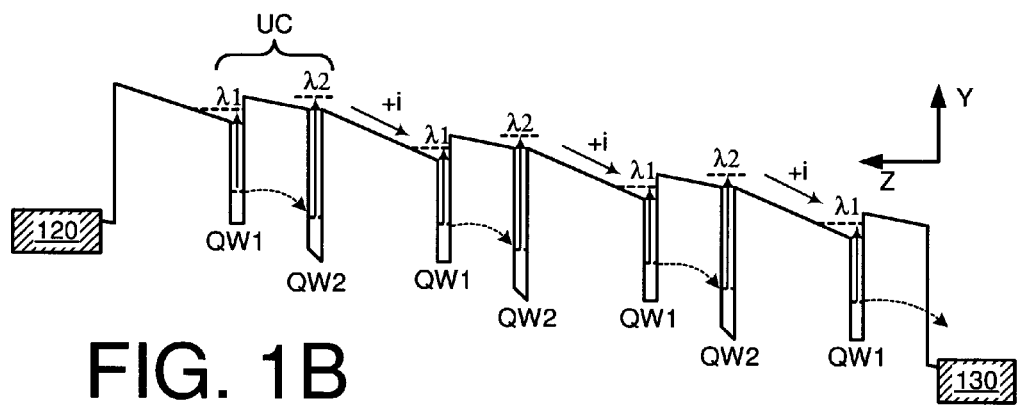
Figure 1C:
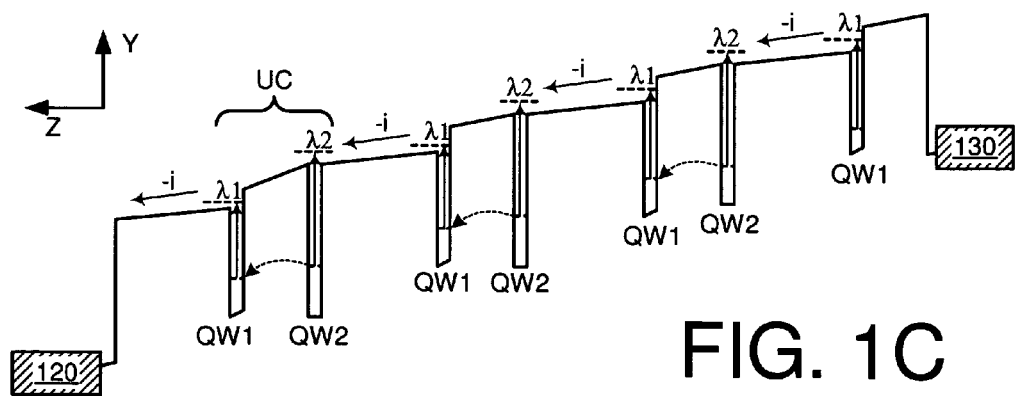

FIGS. 1A through 1C are diagrams illustrating one embodiment of a voltage-tunable multi-color infrared (IR) detector. In the embodiment of FIGS. 1A through 1C, the VT-QWIP material comprises a number of quantum well (QW) unit cells (UC). Specifically, FIGS. 1A through 1C show a structure having 3.5 UC. A first metal contact 120 is located at one end (arbitrarily designated as the top end) of the structure, and a second metal contact 130 is located at another end (arbitrarily designated as the bottom end) of the structure. A voltage is applied across the metal contacts 120, 130 resulting in a bias voltage across the structure.

As shown in FIGS. 1A through 1C, each UC comprises two quantum wells (QW1 and QW2), which are doped using dopants such as, for example, silicon. QW1 is characterized by a ground state (or lower energy state) G1 and an excited state (or higher energy state) E1. The difference in energy between G1 and E1 provides the energy spacing of QW1. Similarly, QW2 is characterized by a ground state G2 and an excited state E2, with the difference in G2 and E2 providing the energy spacing for QW2. QW1 and QW2 are coupled together to permit electrons originating from the dopants to move along the ground states of QW1 and QW2, albeit with a finite impedance. The potential drop among the coupled quantum wells is finite under a bias voltage, and the population of the electrons in each of QW1 and QW2 is determined by the potential difference between QW1 and QW2. QW1 has a detection wavelength of $\lambda 1$ that is defined by the geometric characteristics of QW1, while the detection wavelength of QW2 is defined by the geometric characteristics of QW2. The geometric characteristics include well width and barrier height.

FIG. 1A shows an energy diagram of QW1 and QW2 under zero bias. As shown in FIGS. 1A, during zero bias, electrons occupy both QW1 and QW2, thereby resulting in absorption by both QW1 and QW2. During absorption, electrons are excited from the ground states, G1 of QW1 and G2 of QW2, to the excited states, E1 of QW1 and E2 of QW2, respectively. Once in the excited states, the electrons are free to conduct across the wells and produce photocurrents that are proportional to the conducting electrons. QW1 detects an energy wavelength that is different from the energy wavelength detected by QW2, since the energy spacing of QW1 is different from the energy spacing of QW2.

As shown in FIG. 1B, when a positive bias (arbitrarily defined) is applied across the metal contacts 120, 130, the doped electrons transfer from QW1 to QW2, as shown by the broken arrows in FIG. 1B. Hence, when a positive bias that is sufficient to transfer electrons from QW1 to QW2 is applied to the structure, QW2 will be absorbing and, thus, the structure will be sensitive to $\lambda 2$. In other words, in the presence of positive bias, QW2 will absorb energy at a center wavelength of $\lambda 2$. The photocurrents generated under positive bias are designated as +i in FIG. 1B.

Conversely, as shown in FIG. 1C, when a negative bias (arbitrarily defined) is applied across the metal contacts 120, 130, the doped electrons transfer from QW2 to QW1, as shown by the broken arrows of FIG. 1C. Hence, when sufficient negative bias is applied to the structure, QW1 will be absorbing and, thus, the structure will be sensitive to $\lambda 1$. The photocurrents generated under negative bias are designated as −i in FIG. 1C.

Since the structures shown in FIGS. 1A through 1C, and their concomitant functions, are described in U.S. Pat. No. 5,384,469, issued to Choi on Jan. 24, 1995, further discussion of FIGS. 1A through 1C is omitted here.

FIGS. 2A and 2B are charts illustrating different detected wavelength ranges as a function of applied bias voltages across the voltage-tunable multi-color IR detector of FIGS. 1A through 1C. Specifically, FIGS. 2A and 2B show the response of a two-color VT-QWIP having 36 periods of UC sandwiched between a 0.5 µm-thick n+ Gallium-Arsenide (GaAs) top contact layer and a 1.5 µm bottom contact layer. The 36-period structure is grown on a semi-insulating GaAs substrate by molecular beam epitaxy. The top contact layer has a $1 \times 10^{18}$ cm$^{-3}$ Silicon (Si) doping, while the bottom contact layer has a $5 \times 10^{17}$ cm$^{-3}$ Si doping. Each of the 36 periods includes a 44 Å $Al_{0.05}Ga_{0.95}As$ QW1 coupled to a 44 Å GaAs QW2. QW1 and QW2 are coupled through a 200 Å $Al_{0.3}Ga_{0.7}As$ barrier. Each UC is separated from an adjacent UC by a 350 Å graded $Al_xGa_{1-x}As$ barrier, in which x is graded from 0.3 to 0.25 along the direction of growth. The $Al_{0.05}Ga_{0.95}As$ wells are uniformly doped to $7 \times 10^{17}$ cm$^{-3}$ Si doping. The GaAs wells and barriers are undoped. Since methods for fabricating a structure with these specifications is known, further discussion of those methods, such as molecular beam epitaxy, is omitted here.

As shown in FIG. 2A, when a positive bias is applied to the above-described 36-UC VT-QWIP structure, the detection wavelength centers at approximately 7.6 μm. Specifically, FIG. 2A shows the responsivity of the above-described 36-UC VT-QWIP structure as the positive bias is varied between 0 volts (V) and 3V.

Conversely, as shown in FIG. 2B, when a negative bias is applied to the above-described 36-UC VT-QWIP structure, the detection wavelength centers at approximately 8.8 μm. Specifically, FIG. 2B shows the responsivity of the above-described 36-UC VT-QWIP structure as the negative bias is varied between −1V and −4V.

Figure 3A:
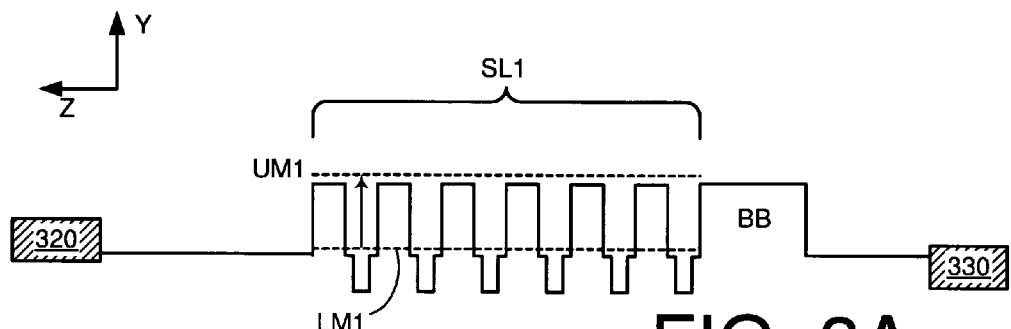
FIGS. 3A through 3C are diagrams illustrating an embodiment of a voltage-tunable superlattice structure.
Figure 3B:
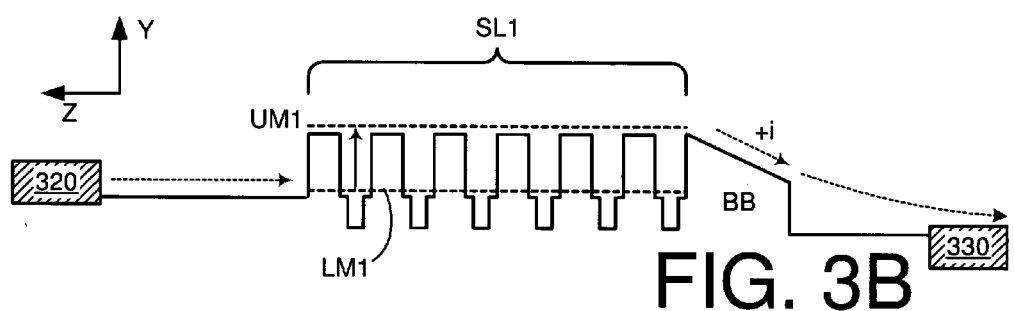
Figure 3C:
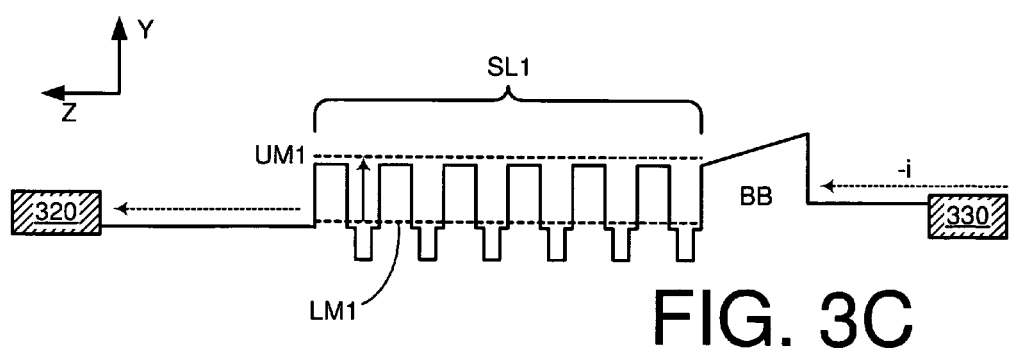

FIGS. 3A through 3C are diagrams illustrating an embodiment of a stand-alone superlattice structure (SL1) together with a blocking barrier (BB). The stand-alone superlattice structure (SL1) comprises a number of quantum wells (QWs) that are strongly coupled such that the ground states of the QWs share energy across SL1 and, also, the excited states of the QWs share energy across SL1. The shared energy of the ground states is referred to as the lower miniband (LM1) while the shared energy of the excited states is referred to as the upper miniband (UM1). The stand-alone superlattice structure (SL1) of FIGS. 3A through 3C may be used to construct a detector, as further discussed in FIGS. 4A through 4C. However, SL1 of FIGS. 3A through 3C, while capable of absorbing radiation, does not function as a detector because both the upper miniband (UM1) and the lower miniband (LM1) of SL1 are equally conducting. Stated differently, in the absence of other structural components that limit the flow of electrons, the stand-alone structure of FIGS. 3A and 3C does not function as a detector. In order to convert SL1 into a detector, a thick blocking barrier (BB) is added to one end of SL1. BB allows electrons in UM1 to conduct through the entire structure from a top contact 320 (+Z) to a bottom contact 330 (−Z). However, BB blocks the conduction of electrons in LM1. The current due to the electrons in UM1 is designated as $i_2$, while the current due to the electrons in LM1 is designated as $i_1$.

Without the presence of light, the electrons are located only in LM1. Since BB prevents the conduction of electrons in LM1 passing from the top contact 320 into the bottom contact 330, $i_1$ reduces to zero and there is no current flow within the circuit. On the contrary, in the presence of light, electrons in LM1 absorb light and promote (or excite) to UM1. These photoelectrons in UM1, thus, create an electrical current $i_2$. Since BB permits conduction of electrons in UM1, $i_2$ is unaffected by BB. Hence, the photocurrent +i under positive bias from the structure of FIG. 3A is equal to $i_2$. Given these conditions, the stand-alone structure SL1, in combination with BB, functions under a positive bias, but does not function under a negative bias.

As shown in FIG. 3B, when a positive bias is applied, low-energy electrons entering from the top contact 320 pass into LM1, where the low-energy electrons absorb energy at wavelength λ1. The absorption of energy promotes (or excites) the low-energy electrons into high-energy electrons in UM1. The high-energy electrons in UM1 pass into the conduction band of BB and are collected at the bottom contact 330. The collected electrons lose energy to phonons (dissipation of energy to the lattice) and plasmons (transfer of energy to surrounding electrons), and, hence, become low-energy electrons. As shown in FIG. 3B, the presence of energy (e.g., light) allows the electrons to complete the circuit, thereby resulting in a large current +i. Conversely, in the absence of energy (e.g., light), the low-energy electrons in LM1 do not transition to UM1. Hence, in the absence of energy, the conduction of low-energy electrons in LM1 is blocked by BB.

As shown in FIG. 3C, when a negative bias is applied, low-energy electrons enter from the bottom contact 330. These low-energy electrons are blocked by BB. Since the low-energy electrons have not yet reached SL1, the low-energy electrons do not transition into high-energy electrons. Hence, the low-energy electrons do not overcome BB and, therefore, the electrons do not complete the circuit. In this regard, the current flow in the circuit remains low due to the low-energy electrons being blocked by BB, both in the absence of light and in the presence of light. The photocurrent −i under negative bias is, thus, zero. Since superlattice structures are described in greater detail in co-pending U.S. patent application Ser. No. 10/411,232 having the title "Quantum-Grid Infrared Photodetector (QGIP) Spectrometers and Related Methods," and filed by Choi on Apr. 11, 2003, only a truncated discussion of superlattice structures is provided here.

Figure 4A:
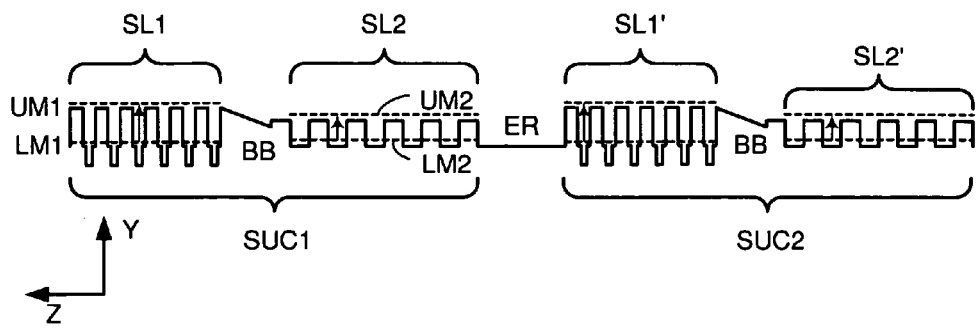
FIGS. 4A through 4C are diagrams illustrating another embodiment of a voltage-tunable multi-color IR detector, which uses the superlattice structure of FIGS. 3A through 3C.
Figure 4B:
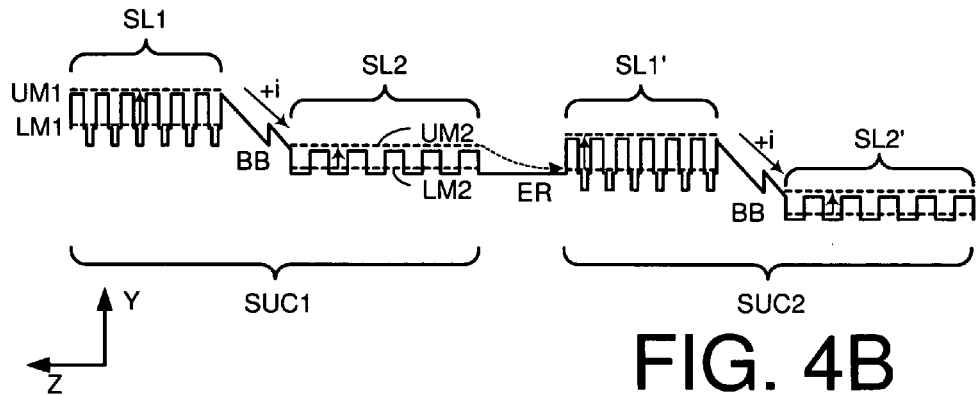
Figure 4C:
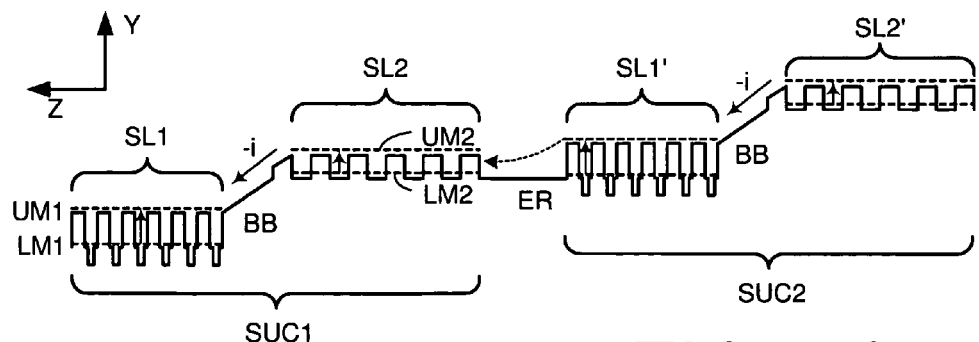

Given the behavior of electrons in UM1 and LM1 for various bias conditions, SL1 of FIGS. 3A through 3C may be used to fabricate another embodiment of a voltage-tunable multi-color IR detector. FIGS. 4A through 4C are digrams illustrating an embodiment of a voltage-tunable multi-color IR detector using superlattices similar to that shown in FIGS. 3A through 3C.

As shown in FIGS. 4A through 4C, a second superlattice (SL2), having an absorption wavelength centered at λ2, is appended to SL1. Thus, under a negative bias, when low-energy electrons enter from −Z (negative Z, or right side of FIGS. 4A through 4C), those low-energy electrons can transition from a lower miniband (LM2) to an upper miniband (UM2) in the presence of λ2-wavelength energy (e.g., light). Since SL1 is also conducting, the electrical circuit is completed and, hence, the current level of the detector is controlled by λ2 under the negative bias. In this regard, a voltage-tunable multi-color IR detector may be constructed by positioning BB between SL1 and SL2, in which SL1 and SL2 have different absorption wavelengths. The structure in which BB is positioned between SL1 and SL2 is referred to herein as a "superlattice unit cell" (SUC). Such a SUC detects λ1-energy under a positive bias voltage, and detects λ2-energy under a negative bias voltage.

While, in principle, a single SUC may be used as a detector, on a practical level, a single SUC absorbs little light and is, therefore, relatively insensitive. The insensitivity of the SUC may be remedied by aggregating a number of unit cells. Unfortunately, a simple stacking of SUCs results in concurrent detection of both wavelengths under the same bias. The concurrent detection of both wavelengths prevents voltage-dependent selection of wavelengths. Thus, in order to accommodate voltage-dependent selection of wavelengths, an energy relaxation layer (ER) is interposed between two SUCs to prevent transportation of high-energy electrons from one SUC to another. The ER is a thick, highly-doped material layer that provides an energy-loss mechanism for high-energy electrons. An embodiment of a two-color detector having SUC1 and SUC2 is shown in FIGS. 4A through 4C.

FIG. 4A shows SUC1 coupled to SUC2 by an ER. SUC1 comprises SL1 and SL2 with BB interposed between SL1 and SL2. Similarly SUC2 comprises SL1' and SL2' with BB interposed between SL1' and SL2'. Each superlattice (SL1, SL1', SL2, or SL2') is a collection of strongly coupled quantum wells, meaning that the impedance of electrons moving among the ground states of any given superlattice is relatively small. Each QW within a particular superlattice may be different or identical. In the embodiments of FIGS. 4A through 4C, the QWs within a single superlattice are identical. However, the QWs between superlattices are substantially different. In other words, intra-superlattice QWs are substantially identical, while inter-superlattice QWs are substantially different. Thus, the QWs of SL1 are substantially different from the QWs of SL2, while the QWs of SL1 are substantially identical to the QWs of SL1'. In this regard, SL1 and SL1' have similar absorption wavelengths and SL2 and SL2' have similar absorption wavelengths. Conversely, SL1 and SL2 have different absorption wavelengths.

Since superlattices offer practically no resistance to the current flow, the potential drop that results from a bias voltage is almost entirely across BB. While BB is shown in FIGS. 4A through 4C as a single, thick barrier, it should be appreciated that another superlattice with a suitable band structure, similar to that described below, may be substituted for BB. For embodiments in which a superlattice is substituted for BB, the substituted superlattice is configured such that the lower miniband of the substituted superlattice aligns with the upper minibands of SL1 and SL2. In this regard, the spectral bandwidth of the structure can be further controlled by the lower miniband of the substituted superlattice.

In the embodiment of FIGS. 4A through 4C, the superlattices (SL1, SL1', SL2, and SL2') are doped while BB is undoped. SUC1 and SUC2 are separated by ER, which is made of highly-doped conducting material such as, for example, GaAs.

FIG. 4A shows an energy band structure of SUC1 and SUC2 under zero bias. As shown in FIG. 4A, since the QWs within SL1 are strongly coupled, the QWs within SL1 share ground states. The shared ground states result in a lower miniband (LM1). Similarly, since the QWs within SL1 are strongly coupled, the QWs within SL1 share excited energy states. The shared excited energy states result in an upper miniband (UM1). For SL2, the QWs are also strongly coupled. Thus, the QWs within SL2 form an upper miniband (UM2) and a lower miniband (LM2) similar to that of SL1. However, since the absorption characteristics of the QWs of SL2 are substantially different from the absorption characteristics of the QWs of SL1, the miniband spacing of SL1 is substantially different from the miniband spacing of SL2. Thus, SL1 and SL2 absorb energy at different center wavelengths.

The BB separating SL1 and SL2 is configured to block current flow when electrons are in LM1 and LM2 but permit current flow when electrons are in UM1 and UM2. In other words, the height of BB is such that ground state electrons are confined to their respective superlattices, while the excited electrons are free to migrate between superlattices.

The generated photocurrent in FIGS. 4A through 4C is the difference in the amount of current flowing across the SUC structures in the presence of light and in the absence of light under a constant bias. In normal operation, the ground state electrons do not conduct because their energies are insufficient to traverse BB. Thus, the difference in the current flow will be the current flow in the excited state and, hence, the photocurrent will be the current flow due to electrons in the excited state. It should, however, be appreciated that, if there should be a finite current flow in the ground state electrons, then the photocurrent will be the difference between the ground state electrons and the excited state electrons.

Thus, when a positive bias is applied, as shown in FIG. 4B, the photocurrent (+i) is proportional to the energy absorption at SL1 and SL1'. Conversely, when a negative bias is applied, as shown in FIG. 4C, the photocurrent (−i) is proportional to the energy absorption of SL2 and SL2'. In this regard, the structure of FIGS. 4A through 4C comprises BB, which permits the passage of high-energy electrons but impedes low-energy electrons, and ER, which permits passage of low-energy electrons but dissipates energy from high-energy electrons.

An example ten-superlattice-unit-cell (10-SUC) structure is provided below for purposes of illustration. The example 10-SUC structure is layered as follows (provided with approximate layer thickness, example composition, and approximate doping):

| [TOP; +Z direction] | | | |
|---|---|---|---|
| Layer 1: | 1,000 Å | GaAs | $N_D = 1 \times 10^{18}$ cm$^{-3}$ doping |
| Layer 2: | | SUC1 | |
| Layer 3: | | SUC2 | |
| Layer 4: | | SUC3 | |
| Layer 5: | | SUC4 | |
| Layer 6: | | SUC5 | |
| Layer 7: | | SUC6 | |
| Layer 8: | | SUC7 | |
| Layer 9: | | SUC8 | |
| Layer 10: | | SUC9 | |
| Layer 11: | | SUC10 | |
| Layer 12: | 2,000 Å | GaAs | $N_D = 1 \times 10^{18}$ cm$^{-3}$ doping |
| Layer 13: | 12,000 Å | GaAs | $N_D = 1 \times 10^{18}$ cm$^{-3}$ doping |
| Layer 14: | 300 Å | Al$_{0.27}$Ga$_{0.73}$As | undoped |
| Layer 15: | 2,500 Å | GaAs | undoped |
| Layer 16: | | GaAs | semi-insulating substrate |
| [BOTTOM; −Z direction] | | | |

Each SUC has the following layered structure:

| SUC Layer 1: | | SL1 | |
|---|---|---|---|
| SUC Layer 2: | | SL1 | |
| SUC Layer 3: | | SL1 | |
| SUC Layer 4: | | SL1 | |
| SUC Layer 5: | | SL1 | |
| SUC Layer 6: | 500 Å | Al$_{0.4}$Ga$_{0.6}$As | undoped |
| SUC Layer 7: | 600 Å | graded Al$_x$Ga$_{1-x}$As with x ranging from 0.22 (−Z) to 0.4 (+Z) | undoped |
| SUC Layer 8: | 500 Å | Al$_{0.27}$Ga$_{0.73}$As | undoped |
| SUC Layer 9: | | SL2 | |
| SUC Layer 10: | | SL2 | |
| SUC Layer 11: | | SL2 | |
| SUC Layer 12: | | SL2 | |
| SUC Layer 13: | | SL2 | |

Each SL1 has the following layered structure:

| SL1 Layer 1: | 30 Å | Al$_{0.4}$Ga$_{0.6}$As | undoped |
|---|---|---|---|
| SL1 Layer 2: | 5 Å | GaAs | $N_D = 2 \times 10^{18}$ cm$^{-3}$ |
| SL1 Layer 3: | 25 Å | In$_{0.34}$Ga$_{0.66}$As | $N_D = 2 \times 10^{18}$ cm$^{-3}$ |
| SL1 Layer 4: | 5 Å | GaAs | $N_D = 2 \times 10^{18}$ cm$^{-3}$ |

Each SL2 has the following layered structure:

| | | | |
|---|---|---|---|
| SL2 Layer 1: | 15 Å | GaAs | undoped |
| SL2 Layer 2: | 35 Å | GaAs | $N_D = 1 \times 10^{18}$ cm$^{-3}$ |
| SL2 Layer 3: | 15 Å | GaAs | undoped |
| SL2 Layer 4: | 40 Å | Al$_{0.27}$Ga$_{0.73}$As | undoped |

Figure 5:
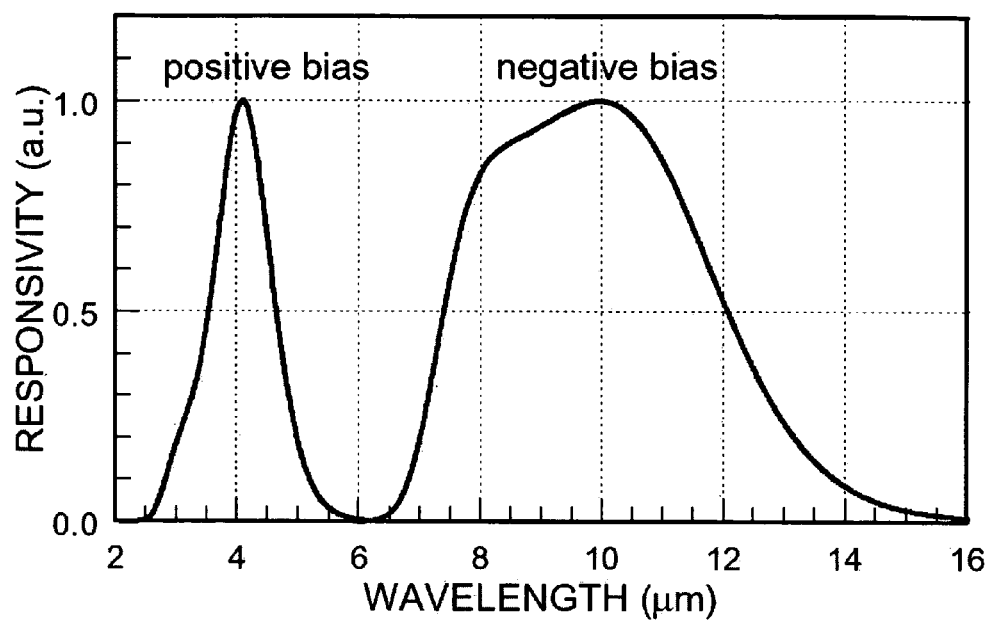
FIG. 5 is a chart illustrating different detected wavelength ranges as a function of applied voltages across an example ten-superlattice-unit-cell structure.

FIG. 5 is a chart illustrating different detected wavelength ranges for the above-described example 10-SUC structure. As shown in FIG. 5, the example 10-SUC structure detects at an approximately 4-μm center wavelength under a positive bias and detects at an approximately 10-μm center wavelength under a negative bias. The example 10-SUC structure has superlattices that are strongly coupled, thereby resulting in wide minibands. The wide minibands, in turn, exhibit themselves as a wide range of wavelengths. Hence, as shown in FIG. 5, the lower bandwidth, while centered around approximately 4 μm, covers a bandwidth between approximately 3 μm and approximately 5 μm. Similarly, the upper bandwidth, while centered around approximately 10 μm, covers a bandwidth between approximately 8 μm and approximately 12 μm.

While the 10-SUC structure is specifically shown to illustrate an example embodiment, it should be appreciated that the miniband widths may be adjusted by appropriately adjusting quantum well parameters, such as, for example, the width and height of the superlattices, the width and height of the blocking barriers, etc.

Figure 6A:
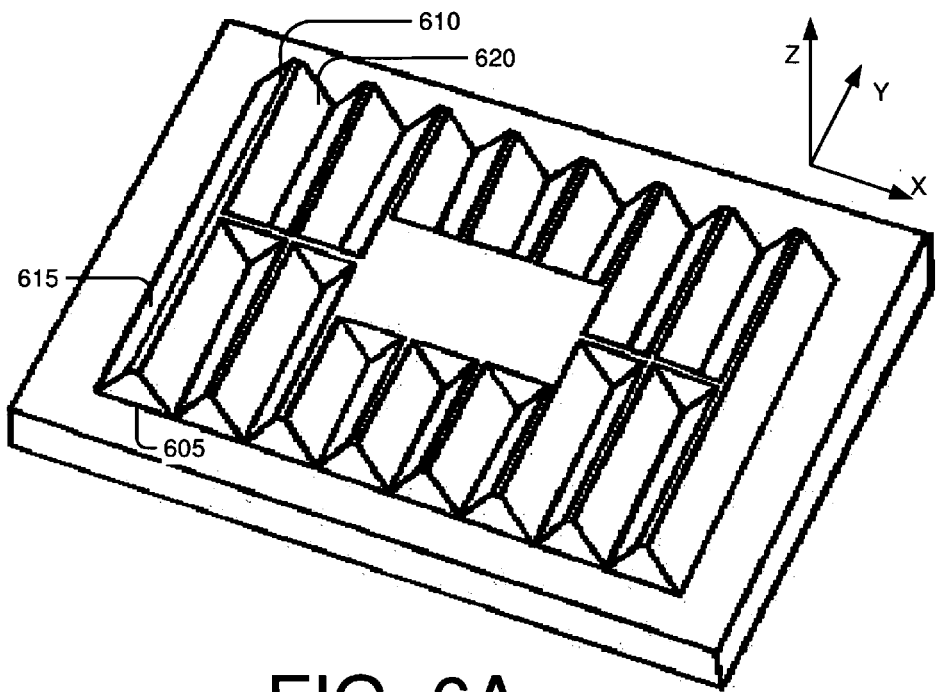
FIGS. 6A and 6B are diagrams illustrating a "corrugated" light coupling scheme that is compatible with the voltage-tunable multi-color IR detectors of FIGS. 1A through 1C and FIGS. 4A through 4C.
Figure 6B:
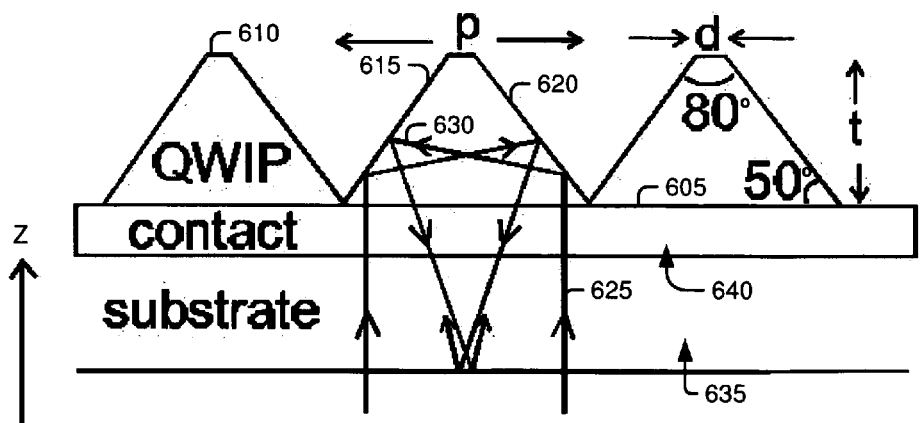

While FIGS. 1A through 5 provides several embodiments of materials and structures for fabricating voltage-tunable multi-color IR detectors, the detectors themselves do not absorb normal incident light (or energy). In this regard, a mechanism is desired in which the normal incident light may be redirected to a direction normal to the Z-axis. FIGS. 6A and 6B are diagrams illustrating an embodiment of a "corrugated" light-coupling scheme that redirects normal incident light, thereby allowing absorption of the light. The corrugated light-coupling scheme is compatible with the voltage-tunable multi-color IR detectors of FIGS. 1A through 1C and FIGS. 4A through 4C.

As shown in FIGS. 6A and 6B, this embodiment of the corrugated light-coupling scheme relies on inclined sides 615, 620 (also referred to herein as "side surfaces" or "side walls") to reflect normal incident light (Z-axis light) for non-normal propagation (non-Z-axis propagation). Since the corrugated light-coupling scheme is discussed in U.S. Pat. No. 5,485,015, "Quantum Grid Infrared Photodetector," issued to Choi on Jan. 16, 1996, only an abridged discussion is provided below.

As shown in FIG. 6B, the corrugated light-coupling scheme, shown in FIG. 6B as a quantum-well infrared photodetector (QWIP), comprises a substantially-planar bottom 605, a top 610, and inclined (or sloped) sides 615, 620. In the embodiment of FIG. 6B, the sides 615, 620 are inclined at an angle of approximately 50 degrees. The bottom 605 of the QWIP is coupled to a substantially-transparent substrate 635. Normal incident light 625 enters the bottom 605 of the QWIP through the substantially-transparent substrate 635. The light 625 is reflected by the sides 615, 620 and, thereafter, becomes non-normal propagating light 630. The non-normal propagating light 630 can be absorbed by the QWIP, thereby permitting detection of energy of various wavelengths, as discussed above. While a trapezoidal QWIP structure is shown in FIG. 6B, it should be appreciated that a triangular structure may be used in lieu of the trapezoidal structure. Indeed, any structure with a profile having inclined sides may be used to redirect the incident light. Several embodiments of structures having inclined sides are shown with reference to FIGS. 8 through 11B below.

Given a corrugated QWIP with sides that are inclined at 45 degrees, the polarized external quantum efficiency, η, which is calculated from the decay of light along the optical path, can be expressed as:

$$\eta(\alpha, p, t) = \frac{4n}{(1+n)^2}\left\{\frac{1}{p}\left[t + \frac{e^{-\alpha p}}{2\alpha}(1-e^{2\alpha t})\right] + K_0\right\}, \quad \text{[Eq. 1]}$$

where n=3.34 is the refractive index of GaAs; p is the corrugation period; t is the height of the corrugations; α is the absorption coefficient of the vertically-polarized parallel-propagation light; and $K_0$ is the internal unpolarized quantum efficiency created by the sides at the ends of the corrugations. An example of the optical path is shown by the solid arrows in FIG. 6B. For infinitely long corrugations, $K_0$ will be zero, but its value increases with decreasing pixel size, where each pixel is defined by a corrugated QWIP. The geometry of a corrugated QWIP is fixed by the structural parameter ratio, t/p. Within the 45-degree side approximation, when t/p=0.5, the corrugation cross-section is a triangle. When t/p decreases, the corrugation cross-section becomes a shallow trapezoid. Detectors with a fixed t/p have a fixed projection area fill factor S ($\equiv$2t/p) available for light reflection.

Figure 7:
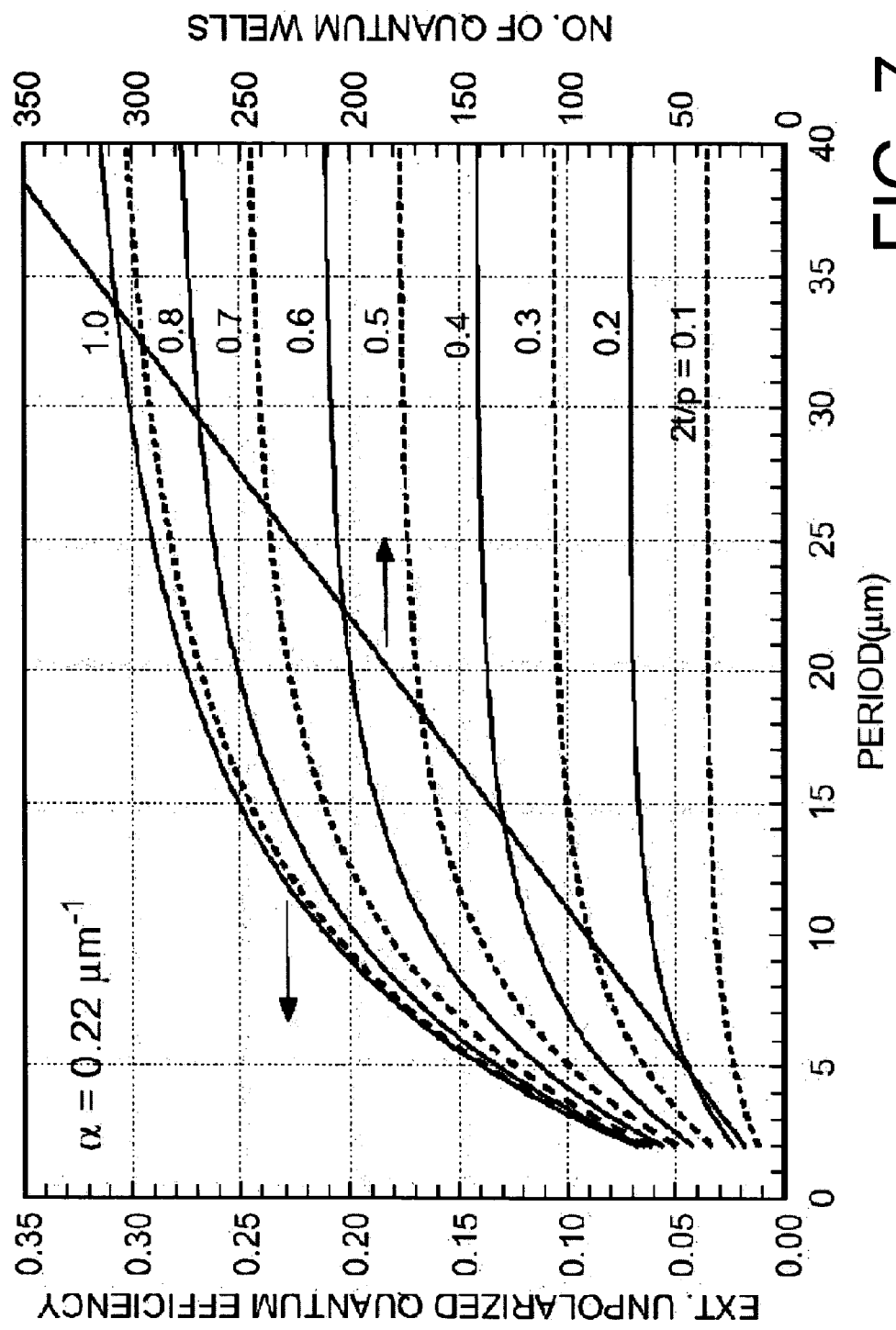
FIG. 7 is a chart illustrating a theoretical performance of quantum-well IR photodetector (QWIP) elements for various different configurations.

FIG. 7 is a chart illustrating a theoretical performance of QWIP elements for various configurations. Specifically, FIG. 7 shows the theoretical η of C-QWIPs for different S$\equiv$2t/p as a function of p for the following conditions: α=0.22 μm$^{-1}$; a geometrical model with $K_0$=0; and a thick substrate. FIG. 7 also shows the corresponding number of quantum well periods for S=1, presuming that the thickness of the QW period is approximately 550 Å. The value of η for a thinned substrate can be read off from the same curve at twice the period, as described below.

As shown in FIG. 7, η is plotted as a function of p while keeping 2t/p fixed. The plot of FIG. 7 presumes a thick substrate. As seen in FIG. 7, the value of η increases at first with p because of the larger active volume. However, when t>>1/α, where α=0.22 μm$^{-1}$ for typical QWIP materials, most of the light incident under the sides is absorbed, and η is then limited purely by the fill factor S. For the triangular corrugations (i.e., S=1), the maximum η is 0.5×0.71× S=0.36, which is half of the unpolarized unit incident power (or the incident radiation) times the transmission coefficient of the substrate. For the trapezoidal corrugation with S=0.5, the maximum η is 0.18. For any given p, S can be increased by using a thicker active material. FIG. 7 shows the number of QW periods required to achieve S=1 for a given p. For example, a triangular corrugation, with p=10 μm, will need 90 QW layers. The value of η can be increased using an anti-reflection coating.

When the substrate is thinned, the reflected light from the substrate will retrace the original path, therefore the optical path length doubles. For the 45-degree side approximation, light propagating at the top of the corrugation will have a total path length of 2(p−2t), and light propagating at the bottom of the corrugation will have a path length of 2p. These path lengths are the same as that in a thick-substrate detector with corrugation period of 2p and the height of 2t.

Since this 2p-period detector also has the same S value, the two detectors are represented by the same curve (i.e., η for a thinned detector can be read off from the same curve in FIG. 7 at twice the p value). For example, for a thinned detector having p=10 μm and S=1, η increases from 21% to 27.5% (read from p=20 μm), which represents a 13% increase. FIG. 7 evidences that the effect of substrate thinning is different for different detector geometries. For example, when p=5 μm and S=1, η will increases from 14 to 21%, which represents a 50% increase. On the other hand, for p=20 μm with S=0.1, there is little increase.

For purposes of clarity, a design example based on pixel area of 25×25 μm² is described herein. For example, in the above-described example 10-SUC structure, the material thickness above the bottom contact layer is approximate 5 μm. For simplicity, a one-corrugation-per-period design is adopted, in which p=25 μm and S=0.4. FIG. 7 shows that η will be approximately 14% with thinned or unthinned substrate.

Figure 8:
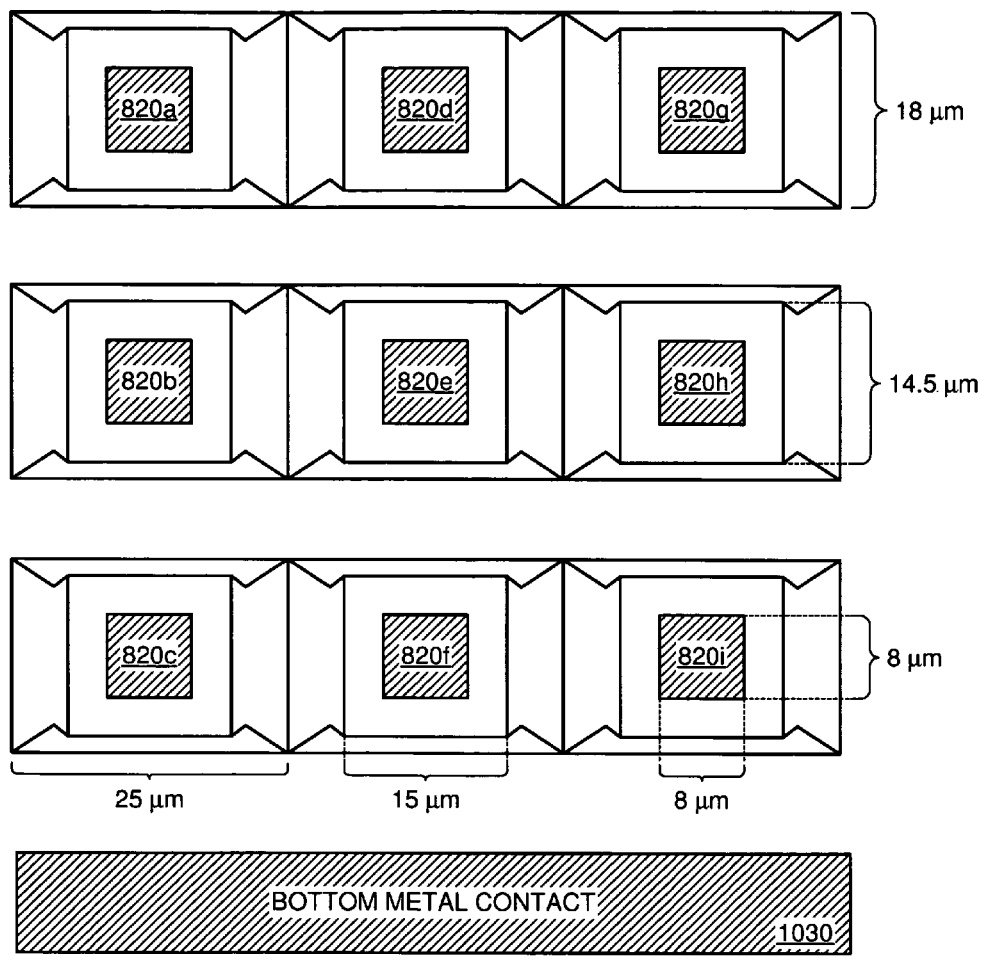
FIG. 8 is a diagram showing a top view of a section of a focal plane array (FPA) camera configured to detect energy at two different ranges of wavelengths.

FIG. 8 is a diagram showing a top view of a section of a focal plane array (FPA) camera configured to detect energy at two different ranges of wavelengths. Specifically, a 3×3 pixel layout of a voltage-tunable two-color FPA is shown in FIG. 8. However, it should be appreciated that the dimensions of the FPA may be scalable by extending the matrix of detectors from 3×3 to any desired resolution. As shown in FIG. 8, the 3×3 voltage-tunable two-color FPA comprises top metal contacts 820a . . . 820i (collectively referred to as 820) that are electrically coupled to the top of each of the voltage-tunable two-color FPA detector elements. Additionally, the voltage-tunable two-color FPA comprises a bottom metal contact 1030 that is electrically coupled to the bottom of the voltage-tunable two-color FPA. In the embodiment of FIG. 8, the top metal contact has an area that is approximately 8 μm by approximately 8 μm; the dimensions of the tops of the detectors are approximately 14.5 μm by approximately 15 μm; and the dimensions of the bottoms of the detectors are approximately 18 μm by approximately 25 μm.

FIGS. 9A and 9B are diagrams showing side views of portions of the FPA camera of FIG. 8. As shown in FIGS. 9A and 9B, each detector 910, 920 is situated on a substantially-transparent substrate 930 that admits incident light 625 (or radiation). Each detector 910, 920 comprises a substantially-planar bottom surface 950 that is coupled to the substantially-transparent substrate 930; a top surface 955 that opposes the bottom surface; and side surfaces 960, 965, 970, 975 that extend between the bottom surface 950 and the top surface 955. As shown in the embodiments of FIGS. 9A and 9B, the side surfaces 960, 965, 970, 975 are substantially non-perpendicular to the bottom surface 950. Additionally, in FIG. 9A, the opposing side surfaces 960, 965 are substantially non-parallel to each other. Similarly, in FIG. 9B, the opposing side surfaces 970, 975 are also substantially non-parallel to each other. Furthermore, as shown in FIGS. 9A and 9B, the side surfaces 960, 965, 970, 975 are defined by piece-wise continuous linear segments. In this regard, FIGS. 9A and 9B demonstrate that the profile for the detectors 910, 920 need not be triangular or trapezoidal, but may be any geometry, so long as the side surfaces 960, 965, 970, 975 provide a reflective surface for redirecting the incident light 625.

The top surfaces 955 of detectors 910, 920 are coupled to the top metal contacts 820a, 820b, respectively. The substantially-transparent substrate 930 is coupled to the bottom metal contact 830. Thus, when a voltage source (not shown) supplies a bias voltage across the top metal contacts 820 and the bottom metal contact 830, a bias voltage is applied across each detector 910, 920. While specific dimensions (in units of μm) for the detectors 910, 920 are shown FIGS. 9A and 9B, it should be appreciated that these dimensions may be varied to affect the sensitivity of the detector elements.

In operation, a positive bias voltage is applied between the top metal contacts 820 and the bottom metal contact 830, thereby configuring the detectors as shown in either FIG. 1B or FIG. 4B. The positive bias voltage permits detection of light at a first wavelength. When a negative bias is applied between the top metal contacts 820 and the bottom metal contact 830, the detectors are configured as shown in either FIG. 1C or FIG. 4C. The negative bias voltage permits detection of light at a second wavelength. For substantially concurrent viewing of two colors, a frame time (i.e., the time for updating a frame) may be subdivided into two periods. During the first period, the signal associated with a first wavelength is integrated in one set of output signals. At the end of the first period, the bias voltage is switched. Thereafter, during the second period, the signal associated with a second wavelength is integrated into another set of output signals. The respective output signals are conveyed to a processor (not shown) that is configured to generate two-dimensional images as a function of the output signals. Since such processors are known to those having skill in the art, further discussion of image generation is omitted here. The two-dimensional images based on the two different wavelengths can then be updated in separate screens. If necessary, the bias voltages can be switched a number of times with output electronics, thereby reducing any time lag of the two signals within the frame time.

Figure 10:
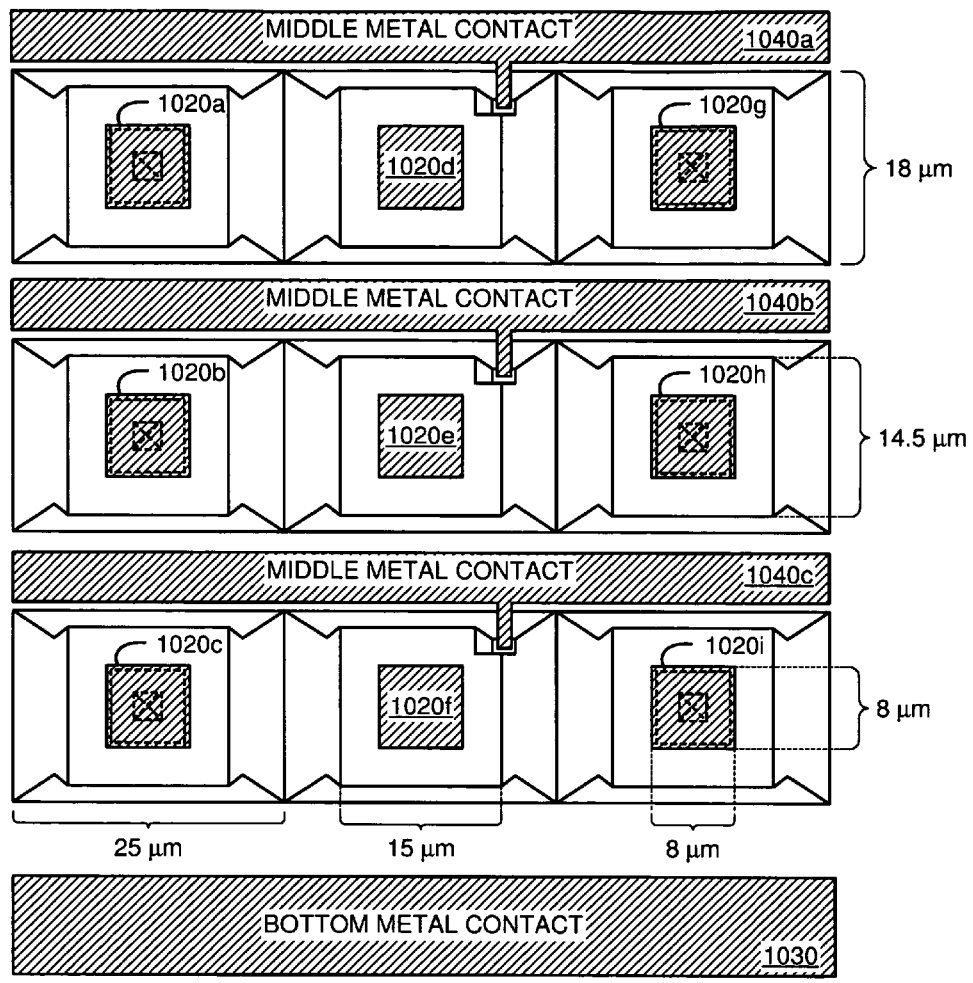
FIG. 10 is a diagram showing a top view of a section of an FPA camera configured to detect energy at four different ranges of wavelengths.

FIG. 10 is a diagram showing a top view of a section of an FPA camera configured to detect energy at four different ranges of wavelengths. Specifically, a 3×3 matrix of detectors is shown in FIG. 10. However, it should be appreciated that, similar to FIG. 8, the dimensions of the FPA in FIG. 10 may be altered by extending the dimensions of the matrix. As shown in FIG. 10, the FPA comprises detectors that are coupled to a bottom metal contact 1030, top metal contacts 1020a . . . 1020i (collectively referred to as 1020), and middle metal contacts 1040a . . . 1040c (collectively referred to as 1040).

FIGS. 11A and 11B are diagrams showing side views of the portion of the FPA camera of FIG. 10. As shown in FIGS. 11A and 11B, a voltage-tunable four-color detector can be fabricated by stacking two-voltage-tunable QWIP elements together and separating them with a middle contact layer 1160. For example, upper QWIP elements 1110, 1130 are stacked on to lower QWIP elements 1120, 1140. Using this approach, the pixels in the FPA are grouped in pairs, represented by a left pixel 1110, 1120 and a right pixel 1130, 1140.

The left pixel 1110, 1120 is short circuited in the upper two-color QWIP stack 1110. Thus, when a positive bias voltage is applied between the bottom metal contact 1030 and the top metal contact 1020a, a first wavelength is detected by the lower-left two-color QWIP stack 1120 while the upper-left two-color QWIP stack 1110 is nonfunctional. Similarly, when a negative bias voltage is applied between the bottom metal contact 1030 and the top metal contact 1020a, a second wavelength is detected by the lower-left two-color QWIP stack 1120 while the upper-left two-color QWIP stack 1110 is nonfunctional.

The right pixel 1130, 1140 is short-circuited in the lower two-color QWIP stack 1140. Thus, when a positive bias voltage is applied between the bottom metal contact 1030 and the top metal contact 1020*d*, a third wavelength is detected by the upper-right two-color QWIP stack 1130 while the lower-right two-color QWIP stack 1140 is non-functional. Similarly, when a negative bias voltage is applied between the bottom metal contact 1030 and the top metal contact 1020*d*, a fourth wavelength is detected by the upper-right two-color QWIP stack 1130 while the lower-right two-color QWIP stack 1140 is nonfunctional.

Given the scheme of FIGS. 11A and 11B, a 1024-by-1024 pixel layout results in a voltage-tunable four-color FPA having a 1024-by-512 spatial resolution. Four screens, each representing one of the four wavelengths, can be displayed substantially simultaneously. In other words, the first screen displays the image generated from the first wavelength acquired by the lower-left pixel during the first period of the time frame; the second screen displays the image generated from the second wavelength acquired by the lower-left pixel during the second period of the time frame; the third screen displays the image generated from the third wavelength acquired by the upper-right pixel during the first period of the time frame; the fourth screen displays the image generated from the fourth wavelength acquired by the upper-right pixel during the second period of the time frame.

To fabricate the voltage-tunable four-color FPA of FIGS. 11A and 11B, the upper-left pixel is short circuited by etching a hole at the center of the pixel to reach the middle contact layer 1160*a*, 1160*b* (collectively 1160). Upon etching the hole, the top metal contact 1020 is evaporated onto the matrix. The evaporated top metal contact 1020 electrically couples to the middle contact layer 1160, thereby resulting in a short circuit. Thus, the lower-left pixel is biased using the top metal contact 1020 and the bottom metal contact 1030.

The lower-right pixel is short-circuited by etching a hole in the corner of the pixel to reach the middle contact layer 1160. Thereafter, the middle contact layer 1160 is electrically coupled to the bottom metal contact 1030 through a middle metal contact 1040. The middle metal contact 1040 effectively short-circuits the lower-right pixel. Thus, the upper-right pixel is also biased using the top metal contact 1020 and the bottom metal contact 1030.

While specific dimensions (in units of $\mu$m) for the detectors 1110, 1120, 1130, 1140 are shown in FIGS. 10, 11A and 11B, it should be appreciated that these dimensions may be varied to affect the sensitivity of the detector elements.

Figure 12:
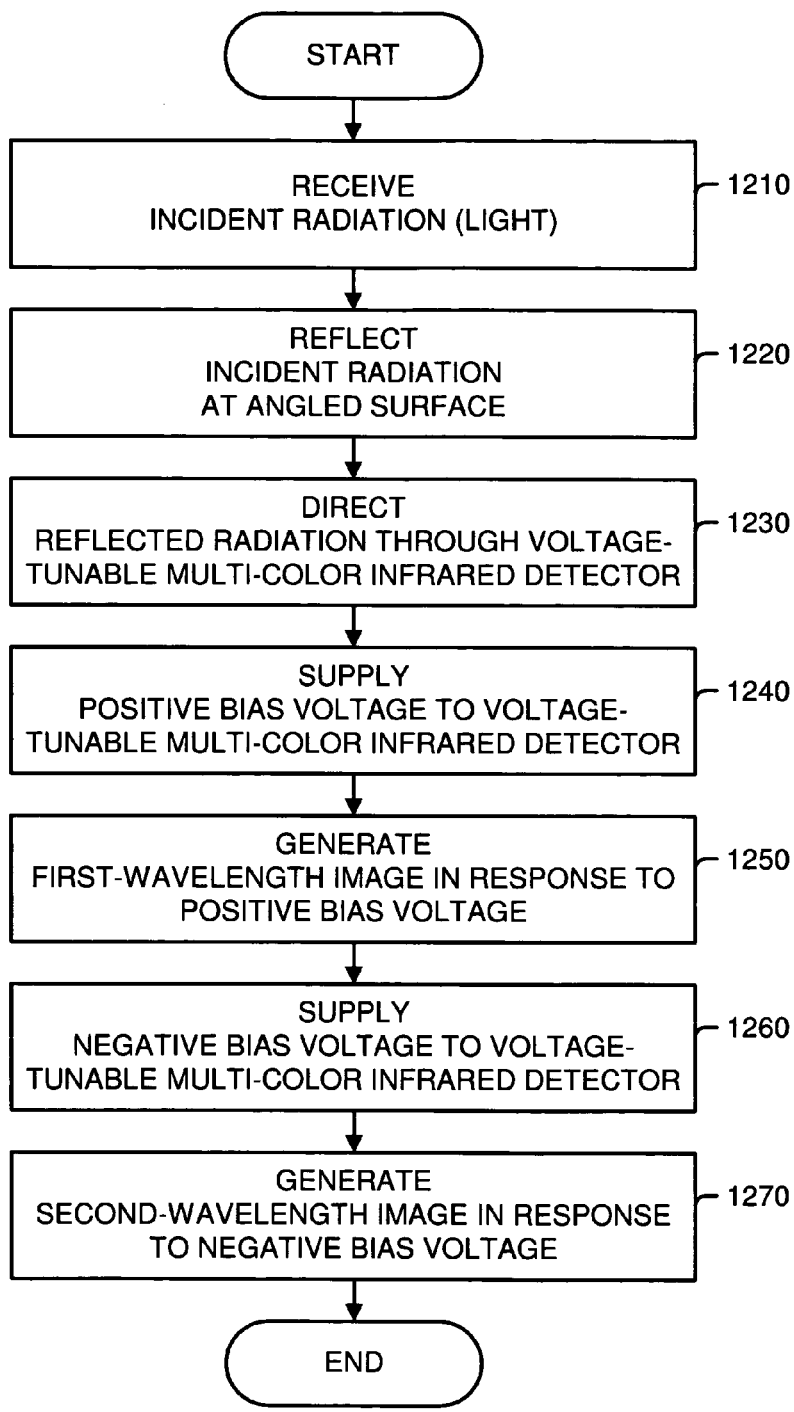
FIG. 12 is a flowchart showing an embodiment of a process for detecting light (or radiation) at different wavelengths.

FIG. 12 is a flowchart showing an embodiment of a process for detecting light (or radiation) at different wavelengths. As shown in FIG. 12, in some embodiments, the process begins when incident radiation (e.g., light) is received (1210). The received radiation is then reflected (1220) by an angled or inclined surface. The inclined surface may appear similar to those shown in FIGS. 6A, 6B, 9A, 9B, 11A, and 11B. The reflected radiation is then directed (1230) through voltage-tunable multi-color IR detectors. In some embodiments, the voltage-tunable multi-color IR detectors may be similar to those shown in FIGS. 1A through 1C and FIGS. 4A through 4C. As the radiation is being directed through the detectors, a positive bias voltage is supplied (1240) to the detectors. The positive bias voltage results in photocurrents that are proportional to the radiation at a first wavelength. These photocurrents are collected and a first-wavelength image is generated (1250) in response to the application of the first bias voltage. In order to detect radiation at a second wavelength, a negative bias voltage is supplied (1260) to the detectors. The negative bias voltage results in photocurrents that are proportional to the radiation at the second wavelength. These photocurrents are collected and a second-wavelength image is generated (1270) in response to the application of the second bias voltage.

As shown in FIGS. 1A through 12, high-resolution multi-color FPA cameras may be constructed by employing the corrugated VT-QWIP materials shown and described above. Such FPA cameras may be useful in medical diagnostics, for example, to detect cancer by suppressing false background signals. The disclosed FPA cameras may also find utility in missile detection in different phases because of background subtraction and target signal optimization. Moreover, the disclosed FPA cameras may be used in drug detection and explosives detection by police; crop monitoring in farming and agriculture; process monitoring and control in manufacture; material fingerprinting (e.g., detection of counterfeit money); exploration of natural resources; infrared astronomy; and chemical, biological, and material research in laboratories.

Since the corrugated VT-QWIP-based FPA camera may be built upon existing readout integrated circuits, the FPA may be producible at low cost and high yield. Additionally, since a single indium bump can be used for each pixel in some embodiments, high pixel density and, hence, high resolution is achievable using the disclosed corrugated VT-QWIP material.

While not explicitly shown, it should be appreciated that the generated photocurrents can be amplified for further processing. In this regard, some embodiments may include a processor or a computer system that receives the amplified photocurrents and generates images from the photocurrents.

Although exemplary embodiments have been shown and described, it will be clear to those of ordinary skill in the art that a number of changes, modifications, or alterations may be made. For example, while two-color detectors and four-color detectors are explicitly shown and described, it should be appreciated that the system is scalable to accommodate any number of wavelengths. Additionally, while specific image resolutions are provided for the disclosed FPA cameras, it should be appreciated that the resolution of the FPA camera may also be scalable. Also, while specific dimensions of the detector elements are shown and described, it should be appreciated that these dimensions may be altered in order to accommodate other geometries and facilitate different light coupling efficiencies. Furthermore, while specific numbers of quantum wells and superlattices are shown and described, it should be appreciated that the number of quantum wells and superlattices may be varied in order to generate different levels of photocurrents. Moreover, while several steps in embodiments of the process are shown as occurring in a specified order, it should be appreciated that the order of the process steps may be varied without adverse effect to the functioning of the detector elements. Also, while specific geometric dimensions are shown, it should be appreciated that these dimensions and units are approximate numbers, and not intended to reflect an exact numerical requirement. All such changes, modifications, and alterations should therefore be seen as within the scope of the disclosure.

What is claimed is:

1. A focal plane array (FPA) camera comprising:
   (I) a tunable voltage source adapted to supply a positive bias voltage and a negative bias voltage, the voltage source comprising:
     (IA) a positive terminal; and
     (IB) a negative terminal;
   (II) a top contact coupled to the positive terminal of the voltage source;

(III) a bottom contact coupled to the negative terminal of the voltage source;
(IV) a substantially-transparent substrate coupled to the bottom contact, the substantially-transparent substrate being adapted to admit light; and
(V) a matrix of detectors, each detector comprising:
(VA) a top surface coupled to the top contact;
(VB) a bottom surface coupled to the substantially-transparent substrate, the bottom surface being substantially parallel to the top surface;
(VC) side surfaces extending from the top surface to the bottom surface, each side surface being substantially non-parallel to an opposing side surface; and
(VD) first-wavelength quantum-well infrared photodetector (QWIP) elements, each first-wavelength QWIP element being a first superlattice of quantum wells adapted to detect energy at a first range of wavelengths when the voltage source supplies the positive bias; and
(VE) second-wavelength QWIP elements, each second-wavelength QWIP element being a second superlattice of quantum wells adapted to detect energy at a second range of wavelengths when the voltage source supplies the negative bias, the second range of wavelengths being different from the first range of wavelengths; and
(VF) wherein an energy relaxation layer is interposed between the first superlattice of quantum wells and the second superlattice of quantum wells.

2. A multi-wavelength detector system comprising:
(I) the focal plane array (FPA) camera of claim 1; and
(II) a processor coupled to the FPA camera, the processor being configured to generate a first-wavelength two-dimensional image, the first-wavelength two-dimensional image being generated from the photocurrents proportional to the detected energy at the first range of wavelengths, the processor further being configured to generate a second-wavelength two-dimensional image, the second-wavelength two-dimensional image being generated from the photocurrents proportional to the detected energy at the second range of wavelengths.

3. The system of claim 2, further comprising:
a display adapted to display the first-wavelength two-dimensional image, the display further being adapted to display the second-wavelength two-dimensional image.

4. The system of claim 3, wherein the display is further adapted to substantially concurrently display the first-wavelength two-dimensional image and the second-wavelength two-dimensional image.

5. A detector comprising:
a first contact;
a second contact;
a substantially-transparent substrate coupled to the second contact, the substantially-transparent substrate being configured to admit light;
a tunable voltage source electrically coupled to the first contact and the second contact, the tunable voltage source being adapted to supply a first bias voltage between the first contact and the second contact, the tunable voltage source further being adapted to supply a second bias voltage between the first contact and the second contact;
a top coupled to the first contact;
a bottom coupled to the substantially-transparent substrate, the bottom adapted to receive the light admitted through the substantially-transparent substrate;
sides extending from the top to the bottom, each side being substantially non-perpendicular to the bottom, each side being adapted to redirect the admitted light;
a first-wavelength quantum-well infrared photodetector (QWIP) element comprising a first superlattice of quantum wells adapted to detect energy proportional to a first range of wavelengths when the tunable voltage source supplies the first bias voltage; and
a second-wavelength QWIP element comprising a second superlattice of quantum wells adapted to detect energy proportional to a second range of wavelengths when the tunable voltage source supplies the second bias voltage; and
wherein an energy relaxation layer is interposed between the first superlattice of quantum wells and the second superlattice of quantum wells.

6. The detector of claim 5:
wherein the first contact is a metal contact; and
wherein the second contact is a metal contact.

7. The detector of claim 5, wherein each side is substantially non-parallel to an opposing side.

8. A voltage-tunable multi-color infrared (IR) detector element comprising:
a first superlattice of quantum wells, the first superlattice being adapted to detect energy at a first range of wavelengths;
a second superlattice of quantum wells, the second superlattice being adapted to detect energy at a second range of wavelengths;
an energy relaxation layer is interposed between the first superlattice of quantum wells and the second superlattice of quantum wells;
wherein each quantum well comprises:
a substantially-planar surface adapted to admit light; and
sides extending from the substantially-planar surface, each side being substantially non-perpendicular to the substantially-planar surface, each side being adapted to redirect the light admitted through the substantially-planar surface.

9. The detector element of claim 8, wherein each side is substantially non-parallel to an opposing side.

10. A light-detection method comprising the steps of:
receiving incident radiation;
reflecting the incident radiation at an angled surface; and
directing the reflected radiation through the voltage-tunable multi-color infrared (IR) detector element of claim 8.

11. The method of claim 10, further comprising the step of:
supplying a first bias voltage to the voltage-tunable multi-color IR detector element to detect energy at a first range of wavelengths.

12. The method of claim 11, further comprising the step of:
generating a first-wavelength image, the first-wavelength image being generated from the detected energy at the first range of wavelengths.

13. The method of claim 11, further comprising the step of:
supplying a second bias voltage to the voltage-tunable multi-color IR detector element to detect energy at a second range of wavelengths.

14. The method of claim 13, further comprising the step of:

generating a first-wavelength image, the first-wavelength image being generated from the detected energy at the first range of wavelengths; and generating a second-wavelength image, the second-wavelength image being generated from the detected energy at the second range of wavelengths.

* * * * *